United States Patent
Yang

(10) Patent No.: US 8,198,139 B2
(45) Date of Patent: Jun. 12, 2012

(54) POWER DEVICE PACKAGE AND METHOD OF FABRICATING THE SAME

(75) Inventor: Gwi-gyeon Yang, Icheon-si (KR)

(73) Assignee: Fairchild Korea Semiconductor Ltd., Bucheon-Si, Gyeonggi-Do (KR)

( * ) Notice: Subject to any disclaimer, the term of this patent is extended or adjusted under 35 U.S.C. 154(b) by 117 days.

(21) Appl. No.: 12/284,217

(22) Filed: Sep. 18, 2008

(65) Prior Publication Data
US 2009/0218666 A1    Sep. 3, 2009

(30) Foreign Application Priority Data
Feb. 28, 2008 (KR) .................. 10-2008-0018531

(51) Int. Cl.
*H01L 21/44* (2006.01)
*H01L 23/495* (2006.01)

(52) U.S. Cl. ............... 438/123; 257/675; 257/E23.031; 257/E21.51

(58) Field of Classification Search .......... 257/666, 257/673, 674–676, 690, 692, 693, 706, 712, 257/685, 686, 777, 723, 787, E25.006, E25.013, 257/E25.021, E25.027, E21.614, E23.004, 257/E23.043, E23.046, E23.047, E23.048, 257/E23.05; 438/107, 112, 124, 127
See application file for complete search history.

(56) References Cited

U.S. PATENT DOCUMENTS

| | | | |
|---|---|---|---|
| 4,680,613 A | 7/1987 | Daniels et al. | |
| 4,720,396 A | 1/1988 | Wood | |
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 5,057,901 A * | 10/1991 | Abel et al. ................ | 257/785 |
| 5,327,325 A | 7/1994 | Nicewarner, Jr. | |
| 5,646,446 A | 7/1997 | Nicewarner, Jr. et al. | |
| 5,703,399 A | 12/1997 | Majumdar et al. | |
| 5,776,797 A * | 7/1998 | Nicewarner et al. ........ | 438/107 |
| 6,133,634 A | 10/2000 | Joshi | |
| 6,329,706 B1 | 12/2001 | Nam | |
| 6,424,035 B1 | 7/2002 | Sapp et al. | |
| 6,432,750 B2 * | 8/2002 | Jeon et al. ................ | 438/122 |
| 6,489,678 B1 | 12/2002 | Joshi | |
| 6,566,749 B1 | 5/2003 | Joshi et al. | |

(Continued)

*Primary Examiner* — Hoa B Trinh
(74) *Attorney, Agent, or Firm* — Kilpatrick Townsend & Stockton LLP

(57) ABSTRACT

Provided are a power device package, which can be made compact by vertically stacking substrates on which semiconductor chips are mounted, and a method of fabricating the power device package. The power device package includes: a first substrate comprising a first surface and a second surface opposite to each other, and a first wiring pattern formed on the first surface; one or more power semiconductor chips mounted on the first surface of the first substrate and electrically connected to the first wiring pattern; a second substrate vertically spaced apart from the first substrate and comprising a second wiring pattern; one or more first control semiconductor chips mounted on the second substrate and electrically connected to the second wiring pattern; a lead frame electrically connected to the first wiring pattern and the second wiring pattern; and a sealing member sealing the first substrate, the power semiconductor chips, the second substrate, the first control semiconductor chips, and at least a part of the lead frame so as to expose the second surface of the first substrate.

21 Claims, 7 Drawing Sheets

U.S. PATENT DOCUMENTS

| | | |
|---|---|---|
| 6,574,107 B2 | 6/2003 | Jeon et al. |
| 6,621,152 B2 | 9/2003 | Choi et al. |
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Joshi et al. |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,972,479 B2 * | 12/2005 | Chen et al. .................. 257/666 |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 7,371,616 B2 | 5/2008 | Jereza |
| 7,439,613 B2 | 10/2008 | Joshi et al. |
| 2001/0052639 A1 | 12/2001 | Jeon et al. |
| 2002/0057553 A1 | 5/2002 | Jeon et al. |
| 2002/0140070 A1 | 10/2002 | Sook-Lim et al. |
| 2003/0011054 A1 | 1/2003 | Jeun et al. |
| 2003/0042403 A1 | 3/2003 | Joshi |
| 2003/0075786 A1 | 4/2003 | Joshi et al. |
| 2003/0085456 A1 | 5/2003 | Lee et al. |
| 2003/0085464 A1 | 5/2003 | Lang |
| 2003/0107126 A1 | 6/2003 | Joshi |
| 2003/0122247 A1 | 7/2003 | Joshi |
| 2003/0139020 A1 | 7/2003 | Estacio |
| 2003/0173659 A1 | 9/2003 | Lee et al. |
| 2004/0041242 A1 | 3/2004 | Joshi |
| 2004/0063240 A1 | 4/2004 | Madrid et al. |
| 2004/0125573 A1 | 7/2004 | Joshi et al. |
| 2004/0137724 A1 | 7/2004 | Joshi et al. |
| 2004/0159939 A1 | 8/2004 | Joshi |
| 2004/0232542 A1 | 11/2004 | Madrid |
| 2005/0056918 A1 | 3/2005 | Jeun et al. |
| 2005/0167848 A1 | 8/2005 | Joshi et al. |
| 2006/0125093 A1 * | 6/2006 | Kang et al. .................. 257/723 |
| 2006/0129061 A1 * | 6/2006 | Kaneto et al. ................. 600/561 |
| 2007/0075409 A1 * | 4/2007 | Letterman et al. ............ 257/678 |
| 2007/0170569 A1 * | 7/2007 | Kim et al. ..................... 257/685 |
| 2007/0181984 A1 | 8/2007 | Son et al. |
| 2007/0205503 A1 | 9/2007 | Baek et al. |
| 2007/0284947 A1 | 12/2007 | Lee et al. |
| 2008/0136015 A1 | 6/2008 | Lee et al. |
| 2008/0157310 A1 | 7/2008 | Lee et al. |
| 2008/0164588 A1 | 7/2008 | Lee et al. |
| 2008/0164589 A1 | 7/2008 | Son et al. |

* cited by examiner

POWER DEVICE PACKAGE AND METHOD OF FABRICATING THE SAME

CROSS-REFERENCES TO RELATED APPLICATIONS

This application claims the benefit of Korean Patent Application No. 10-2008-0018531, filed on Feb. 28, 2008, in the Korean Intellectual Property Office, the disclosure of which is incorporated herein in its entirety by reference.

BACKGROUND OF THE INVENTION

1. Field of Invention

The present invention relates to a power device package and a method of fabricating the same, and more particularly, to a power device package, which can be made compact by vertically stacking substrates on which semiconductor chips are mounted, and a method of fabricating the power device package.

2. Description of the Related Art

As the power electronic industry continues to use power devices (e.g., a power transistor, an insulated-gate bipolar transistor (IGBT), a MOS transistor, a silicon-controlled rectifier (SCR), a power rectifier, a servo driver, a power regulator, an inverter, or a converter), demands for lighter and smaller power products having better performance are increasing.

To meet the demands, smart power modules or intelligent power modules which can integrate not only various power semiconductor chips but also control semiconductor chips, such as integrated circuit chips, for controlling the power semiconductor chips, into one package, have been actively studied.

FIG. 1A is a top plan view of a conventional power device package 1. FIG. 1B is a cross-sectional view taken along line A-A of FIG. 1A.

Referring to FIGS. 1A and 1B, the conventional power device package 1 includes a first substrate 2 and a second substrate 3 which are disposed horizontally. In general, power semiconductor chips 6 are mounted on the first substrate 2, and control semiconductor chips 7 are mounted on the second substrate 3. The first substrate 2 and the second substrate 3 are electrically connected to each other by using a wire 8. Each of the first substrate 2 and the second substrate 3 is electrically connected to a lead frame 4, and is electrically connected to the outside of the conventional power device package 1 through external leads 5. A sealing member 9 seals the power semiconductor chips 6 and the control semiconductor chips 4, thereby completing the conventional power device package 1. U.S. Pat. No. 5,703,399 assigned to Mitsubishi discloses such a conventional power device package in which power semiconductor chips and control semiconductor chips mounted on one lead frame are molded into one package.

However, since the power semiconductor chips and the control semiconductor chips are horizontally mounted on the lead frame facing a substrate, it is difficult to reduce the area of the conventional power device package. Therefore, there is a limitation in increasing the integration density of the conventional power device package.

BRIEF SUMMARY OF THE INVENTION

Embodiments of the present invention provide for a power device package that can be made compact by vertically stacking substrates on which semiconductor chips are mounted.

Embodiments of the present invention also provides a method of fabricating a power device package that can be made compact by vertically stacking substrates on which semiconductor chips are mounted.

According to an aspect of the present invention, there is provided a power device package comprising: a first substrate comprising a first surface and a second surface opposite to each other, and a first wiring pattern formed on the first surface; one or more power semiconductor chips mounted on the first surface of the first substrate and electrically connected to the first wiring pattern; a second substrate vertically spaced apart from the first substrate and comprising a second wiring pattern; one or more first control semiconductor chips mounted on the second substrate and electrically connected to the second wiring pattern; a lead frame electrically connected to the first wiring pattern and the second wiring pattern; and a sealing member sealing the first substrate, the power semiconductor chips, the second substrate, the first control semiconductor chips, and at least a part of the lead frame so as to expose the second surface of the first substrate.

The power device package may further comprise one or more support members supporting the second substrate so that the second substrate is spaced apart from the first substrate. The support members may be insulating support members or conductive support members. When the support members are conductive support members, the support members may electrically connect the second substrate to the first substrate or to the lead frame.

One end or both ends of the second substrate may be supported by the lead frame so that the second substrate is spaced apart from the first substrate. The lead frame may further comprise one or more insertion portions formed on one side or both sides of ends thereof, wherein one end or both ends of the second substrate are inserted into the insertion portions of the lead frame.

The first control semiconductor chips may be mounted on one surface or both surfaces of the second substrate. The first control semiconductor chips may be mounted on the second substrate to be electrically connected to the second substrate in the form of flip chips, or may be electrically connected to the second substrate by using a wire or a solder ball.

The power device package may further comprise second control semiconductor chips mounted on the first surface of the first substrate or on the lead frame and controlling the power semiconductor chips. The second control semiconductor chips may be mounted on the first substrate or the lead frame to be electrically connected to the first substrate or to the lead frame in the form of flip chips, or may be electrically connected to the first substrate or to the lead frame by using a wire or a solder ball.

The second substrate may be a printed circuit board (PCB), a ceramic substrate, an insulated metal substrate (IMS), a pre-molded substrate, a direct bonded copper (DBC) substrate, or a flexible PCB. When the second substrate is a flexible PCB, the second substrate may be curved to form a plurality of mount surfaces that are spaced apart from each other to face each other, wherein the first control semiconductor chips are mounted on at least some of the mount surfaces.

A plurality of second substrates may be used, wherein a plurality of mount surfaces of the second substrates are spaced apart from each other to face each other, wherein the first control semiconductor chips are mounted on at least some of the mount surfaces.

The first substrate may be a PCB, an IMS, a pre-molded substrate, or a DBC substrate.

The power semiconductor chips may include power metal oxide semiconductor field effect transistors (MOSFETs), bipolar junction transistors (BJTs), insulated-gate bipolar transistors (IGBTs), diodes, or combinations thereof. The power semiconductor chips may be electrically connected to the first wiring pattern of the first substrate in the form of flip chips, or may be electrically connected to the first wiring pattern of the first substrate by using a wire or a solder ball. The wire may include aluminum (Al) or gold (Au).

The first wiring pattern may include aluminum, an aluminum alloy, copper, a copper alloy, or a combination thereof.

The first wiring pattern and the lead frame may be electrically connected to each other by using solder, solder paste, silver (Ag) paste, or a combination thereof.

The sealing member may include an epoxy molding compound (EMC), a polyimide, a silicone, a silicone rubber, or a combination thereof.

The power device package may further comprise a heat sink attached to the second surface of the first substrate and dissipating heat. The heat sink may include aluminum, an aluminum alloy, copper, a copper alloy, $Al_2O_3$, BeO, AlN, SiN, an epoxy-based resin, or a combination thereof.

According to another aspect of the present invention, there is provided a method of fabricating a power device package, the method comprising: preparing a first substrate comprising a first surface and a second surface opposite to each other, and a first wiring pattern formed on the first surface; mounting one or more power semiconductor chips on the first surface of the first substrate; electrically connecting the power semiconductor chips and the first wiring pattern; preparing a second substrate vertically spaced apart from the first substrate, and comprising a second wiring pattern and one or more first control semiconductor chips electrically connected to the second wiring pattern; electrically connecting the first wiring pattern and the second wiring pattern to a lead frame; and sealing the first substrate, the power semiconductor chips, the second substrate, the first control semiconductor chips, support members, and a part of the lead frame by using a sealing member so as to expose the second surface of the first substrate.

The preparation of the second substrate may comprise: preparing one or more support members on the first surface of the first substrate; and disposing the second substrate on the support members.

After the sealing of the first substrate, the power semiconductor chips, the second substrate, the first control semiconductor chips, the support members, and the part of the lead frame, the method may further comprise: performing trimming to leave only external leads exposed to the outside of the sealing member among leads of the lead frame; and performing forming to bend the external leads.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
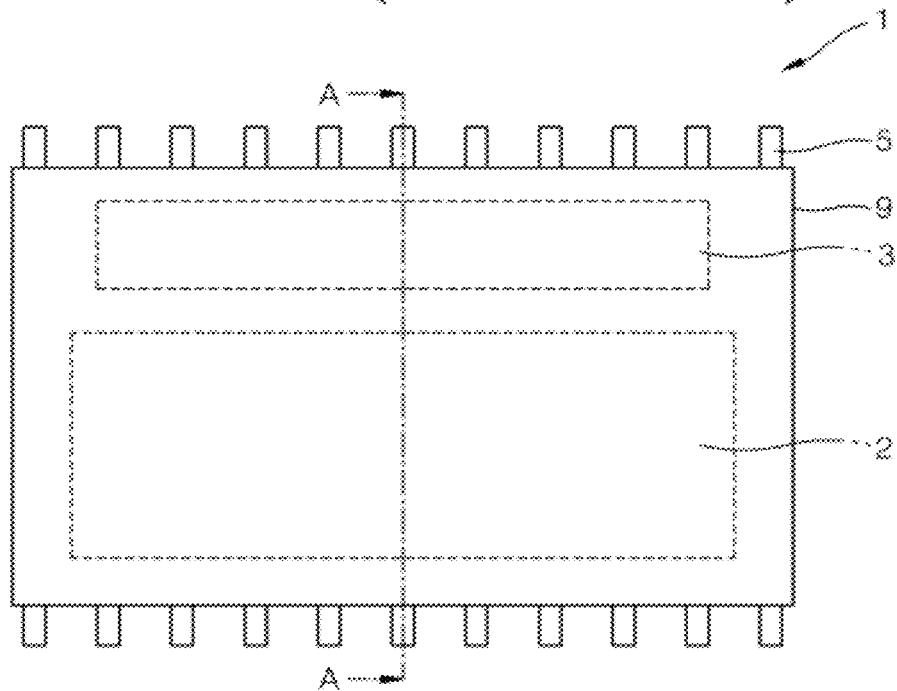
FIG. 1A is a top plan view of a conventional power device package.
Figure 1B:
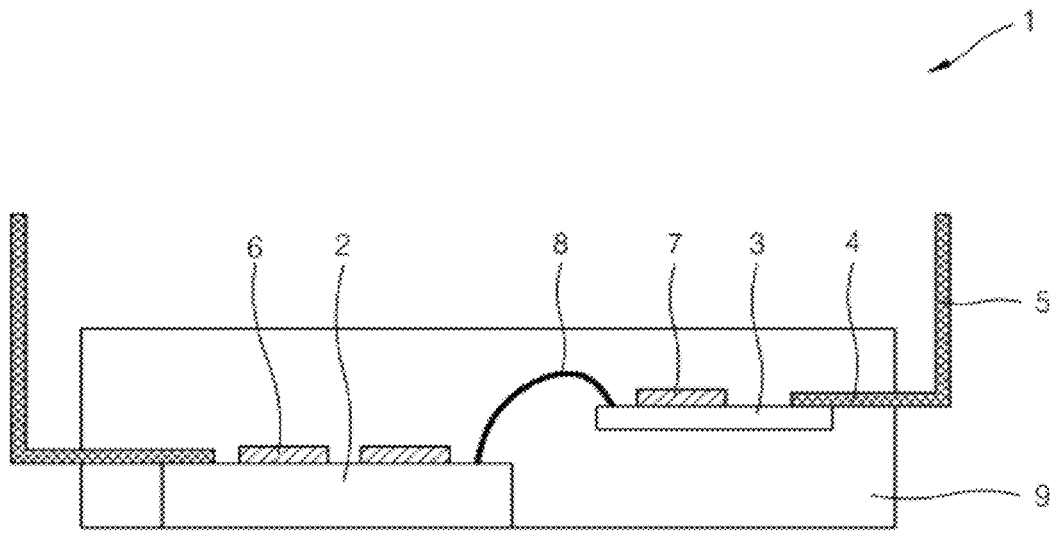
FIG. 1B is a cross-sectional view taken along line A-A of FIG. 1A.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

It is also understood that like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
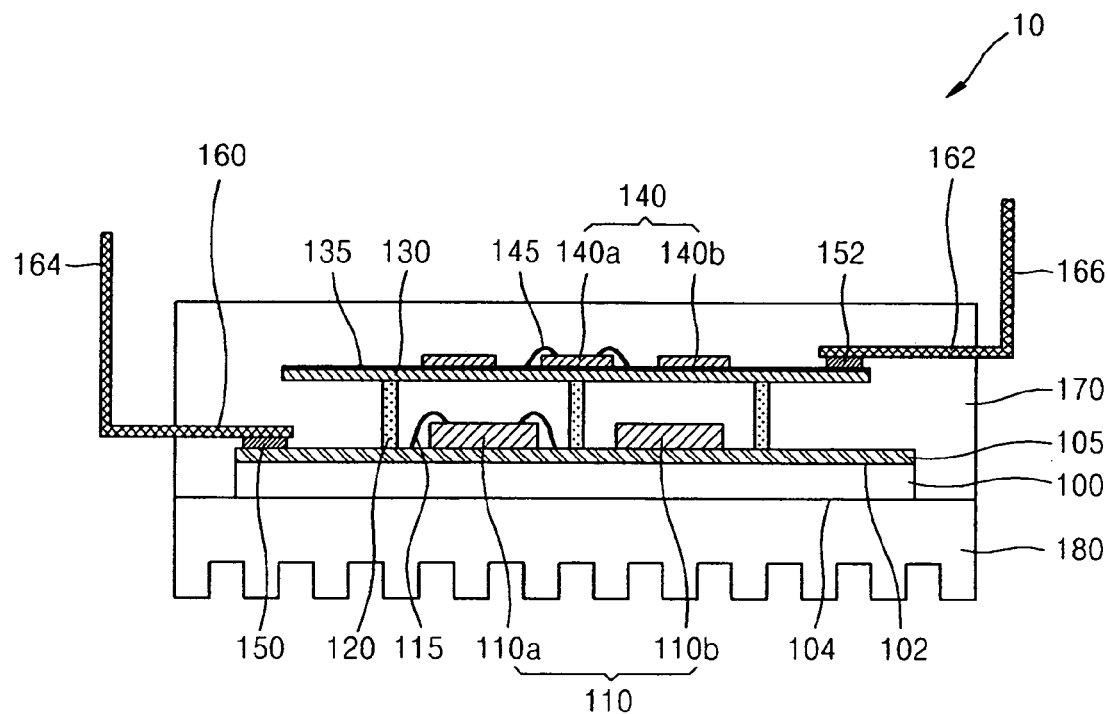
FIG. 2 is a schematic cross-sectional view of a power device package according to an embodiment of the present invention.

FIG. 2 is a schematic cross-sectional view of a power device package 10 according to an embodiment of the present invention.

Referring to FIG. 2, the power device package 10 includes a first substrate 100, one or more power semiconductor chips 110, a second substrate 130, one or more first control semiconductor chips 140, first and second lead frames 160 and 162, and a sealing member 170. The first substrate 100 includes a first surface 102 and a second surface 104 opposite to each other, and a first wiring pattern 105 formed on the first surface 102. The power semiconductor chips 110 are mounted on the first surface 102 of the first substrate 100 and are electrically connected to the first wiring pattern 105. The second substrate 130 is vertically spaced apart from the first substrate 100 and includes a second wiring pattern 135 formed thereon. The first control semiconductor chips 140 are mounted on the second substrate 130 and are electrically connected to the second wiring pattern 135. The first and second lead frames 160 and 162 are electrically connected to the first wiring pattern 105 and the second wiring pattern 135, respectively. The sealing member 170 seals the first substrate 100, the power semiconductor chips 110, the second substrate 130, the first control semiconductor chips 140, and at least a part of each of the first and second lead frames 160 and 162 so as to expose the second surface 104 of the first substrate 100.

The power device package 10 may further include a heat sink 180 attached to the second surface 104 of the first substrate 100 and dissipating heat.

FIGS. 3A through 3G are schematic cross-sectional views illustrating a method of fabricating the power device package 10 of FIG. 2 according to an embodiment of the present invention.

Figure 3A:
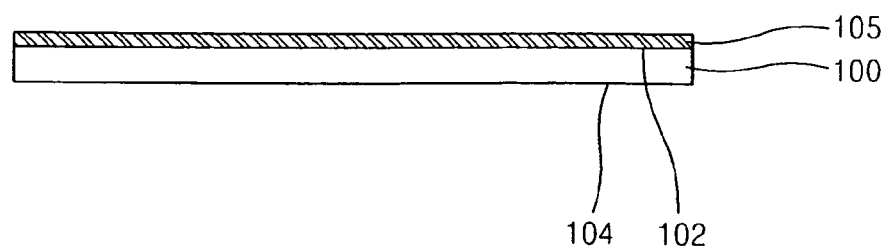
FIGS. 3A through 3G are schematic cross-sectional views illustrating a method of fabricating the power device package of FIG. 2 according to an embodiment of the present invention.

Referring to FIG. 3A, a first substrate 100 having a first surface 102 and a second surface 104 opposite to each other is prepared. The first substrate 100 may be a printed circuit board (PCB), a ceramic substrate, an insulated metal substrate (IMS), a pre-molded substrate, or a direct bonded copper (DBC) substrate. The first substrate 100 may be a conductive substrate provided by a lead frame. The first substrate 100 may be formed of a metal-based nitride or a ceramic material. The metal-based nitride may be an aluminum nitride (AlN) or a silicon nitride (SiN), and the ceramic material may be an aluminum oxide (Al2O3) or a beryllium oxide (BeO). However, the materials are exemplary and the present invention is not limited thereto.

Next, a first wiring pattern 105 is formed on the first surface 102 of the first substrate 100. The first wiring pattern 105 may be formed by a typical film deposition method, such as chemical vapor deposition (CVD) or physical vapor deposition (PVD), or a plating method, such as electroplating or electroless plating. The first wiring pattern 105 may include a conductive material such as a metal. For example, the first wiring pattern 105 may include aluminum, an aluminum alloy, copper, a copper alloy, or a combination thereof. The first wiring pattern 105 may further include nickel, gold, or an alloy thereof. In other words, when the first wiring pattern 105 is formed of a material with poor oxidation resistance, such as copper or a copper alloy, the first wiring pattern 105 may be coated with a layer including nickel, gold, or an alloy thereof to prevent oxidation of the copper or copper alloy. However, the materials of the first wiring pattern 105 are exemplary and the present invention is not limited thereto.

The forming of the first wiring pattern 105 may be optional. That is, when the first substrate 100 is a PCB, an IMS, or a DBC substrate as described above, the first substrate 100 may already include a pre-formed wiring pattern. In this case, the forming of the first wiring pattern 105 may be omitted.

Figure 3B:
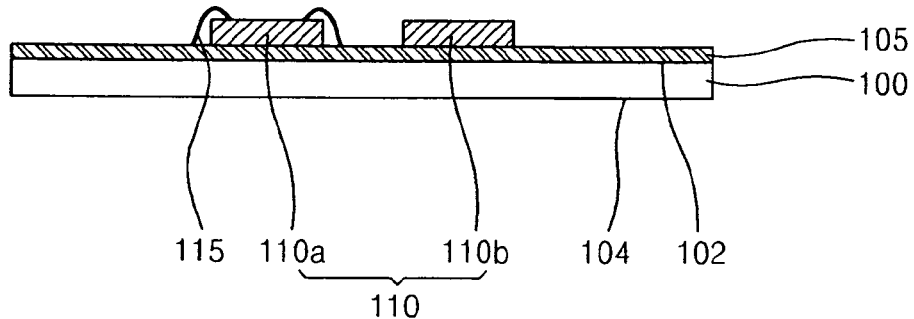

Referring to FIG. 3B, one or more power semiconductor chips 110 are mounted on the first surface 102 of the first substrate 100 and are electrically connected to the first wiring pattern 105.

The power semiconductor chips 110 may be power circuit chips for power conversion or power control such as servo drivers, inverters, power regulators, or converters. For example, the power semiconductor chips 110 may include power metal oxide semiconductor field effect transistors (MOSFETs), bipolar junction transistors (BJTs), insulated-gate bipolar transistors (IGBTs), diodes, or combinations thereof. In other words, the power semiconductor chips 110 may include all or some of the listed items. For example, two power semiconductor chips 110a and 110b shown in FIG. 3B may be an IGBT and a diode, respectively. As such, the power device package 10 may include six power semiconductor chip pairs each including one IGBT and one diode. However, this is exemplary and the present invention is not limited thereto.

Although not shown, the power semiconductor chips 110 may be attached to the first surface 102 of the first substrate 100 by using an adhesive member (not shown). The adhesive member may be conductive or non-conductive. For example, the adhesive member may be formed by plating, or may be a conductive paste or a conductive tape. Also, the adhesive member may be solder, a metal epoxy, a metal paste, a resin-based epoxy, or an adhesive tape with high heat resistance. For example, the adhesive tape may be a well-known high temperature-resistant tape such as a common glass tape, a silicone tape, a Teflon tape, a stainless foil tape, or a ceramic tape. Alternatively, the adhesive member may be formed by combining the aforesaid materials. However, the forming and materials of the adhesive member are exemplary and the present invention is not limited thereto.

The power semiconductor chips 110 and the first wiring pattern 105 are electrically connected to each other. The power semiconductor chips 110 may be electrically connected to the first wiring pattern 105 of the first substrate 100 in the form of flip chips, or may be electrically connected to the first wiring pattern 105 of the first substrate 100 by using a wire or a solder ball. In FIG. 3B, the power semiconductor chips 110a are electrically connected to the first wiring pattern 105 by using a wire 115, and the power semiconductor chips 110b are electrically connected to the first wiring pattern 105 in the form of flip chips or by using a solder ball (not shown). However, this is exemplary and the present invention is not limited thereto.

The wire 115 may include a metal such as aluminum (Al), an aluminum alloy, gold (Au), or a gold alloy. The power semiconductor chips 110 and the first wiring pattern 105 may be connected to each other by using the wire 115 by ball bonding, wedge bonding, or stitch bonding which is well known in this art.

For this electrical connection, each of the power semiconductor chips 110 and the first wiring pattern 105 may include a connection portion such as a typical connection pad. In some embodiments, only one or both of the power semiconductor chips 110a are electrically connected to the first wiring pattern 105 by using the wire 115. The power semiconductor chips 110b can be in the form of flip chips and can be electrically connected to the first wiring pattern 105 by using solder balls or the like. They may be mounted in the power device package 10.

Figure 3C:
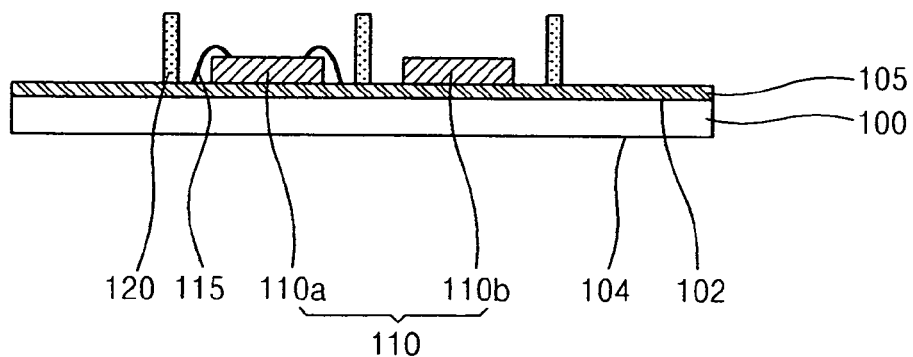

Referring to FIG. 3C, one or more support members 120 are disposed on the first surface 102 of the first substrate 100. The support members 120 support a second substrate 130 (see FIG. 3D) so that the second substrate 130 can be vertically spaced apart from the first substrate 100 in a later process. It is preferable that the support members 120 have a height greater than that of the power semiconductor chips 110. The dimensions and number of the support members 120 can be properly determined. The support members 120 may be fixed to the first substrate 100 by using such an adhesive member as described above. The support members 120 may be insulating support members or conductive support members. In particular, when the support members 120 are conductive support members, the support members 120 can electrically connect the second substrate 130 to the first substrate 110 or to a lead frame 166. Also, the support members 120 can electrically connect first control semiconductor chips 140 and the power semiconductor chips 110. The support members 120 may include aluminum, an aluminum alloy, copper, a copper alloy, or a combination thereof, and may further include nickel, gold, or an alloy thereof. The support members 120 may be a pattern formed by a typical patterning method.

Figure 3D:
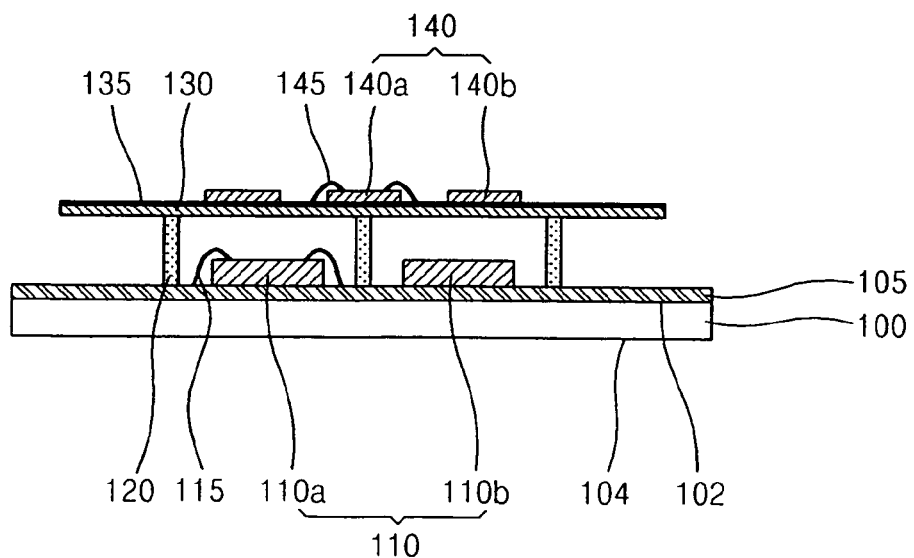

Referring to FIG. 3D, the second substrate 130 is disposed to be vertically spaced apart from the first substrate 100. In detail, the second substrate 130 is disposed on the support members 120, such that the second substrate 130 is vertically spaced apart from the first substrate 100. The support members 120 may be adhered to the second substrate 130 by using such an adhesive member as described above. The second substrate 130 may be a PCB, a ceramic substrate, an IMS, a pre-molded substrate, a DBC substrate, or a flexible PCB. The second substrate 130 may be formed of a metal-based nitride or a ceramic material. The metal-based nitride may be an aluminum nitride (AlN) or a silicon nitride (SiN), and the ceramic material may be an aluminum oxide (Al2O3) or a beryllium oxide (BeO). However, the materials are exemplary and the present invention is not limited thereto.

The second substrate 130 includes a second wiring pattern 135 formed on one surface or both surfaces, or on the inside thereof. The second wiring pattern 135 may be formed by a typical film deposition method, such as CVD or PVD, or a plating method, such as electroplating or electroless plating. The second wiring pattern 135 may include a conductive material such as a metal. For example, the second wiring pattern 135 may include aluminum, an aluminum alloy, copper, a copper alloy, or a combination thereof. The second wiring pattern 135 may further include nickel, gold, or an alloy thereof. In other words, when the second wiring pattern 135 is formed of a material with poor oxidation resistance, such as copper or a copper alloy, the second wiring pattern 135 may be coated with a layer including nickel, gold, or an alloy thereof to prevent oxidation of the copper or copper alloy. However, the materials of the second wiring pattern 135 are exemplary and the present invention is not limited thereto. When the second substrate 130 may be a PCB, a flexible PCB, an IMS, or a DBC substrate as described above, the second wiring pattern 135 may be a pre-formed wiring pattern.

The second substrate 130 includes one or more first control semiconductor chips 140 mounted thereon and electrically connected to the second wiring pattern 135. The first control semiconductor chips 140 may be electrically connected to the second wiring pattern 135 in the form of flip chips, or may be electrically connected to the second wiring pattern 135 by using a solder ball. In FIG. 3D, first control semiconductor chips 140a are electrically connected to the second wiring pattern 135 by using a wire 145, and first control semiconductor chips 140b are in the form of flip chips and are electrically connected to the second wiring pattern 135 by using solder balls (not shown).

The wire 145 may include a metal such as aluminum (Al), an aluminum alloy, gold (Au), or a gold alloy. The first control semiconductor chips 140 and the second wiring pattern 135 may be connected to each other by using the wire 145 by ball bonding, wedge bonding, or stitch bonding which is well known in this art.

As shown in FIG. 3D, the first control semiconductor chips 140 are electrically connected to the power semiconductor chips 110 through the support members 120 or first and second lead frames 160 and 162, which are installed in a later process, such that the first control semiconductor chips 140 can control the operations of the power semiconductor chips 110. The first control semiconductor chips 140 may be microprocessors, passive devices, such as resistors, inverters, or condensers, and/or active devices, such as transistors. One power device package 10 may include a few to tens of first control semiconductor chips 140. The type and number of the first control semiconductor chips 140 can be determined according to the type and number of the power semiconductor chips 110.

The second substrate 130 may be disposed on the support members 120 after the first control semiconductor chips 140 are mounted on the second substrate 130, or the first control semiconductor chips 140 may be mounted on the second substrate 130 after the second substrate 130 is mounted on the support members 120.

Figure 3E:
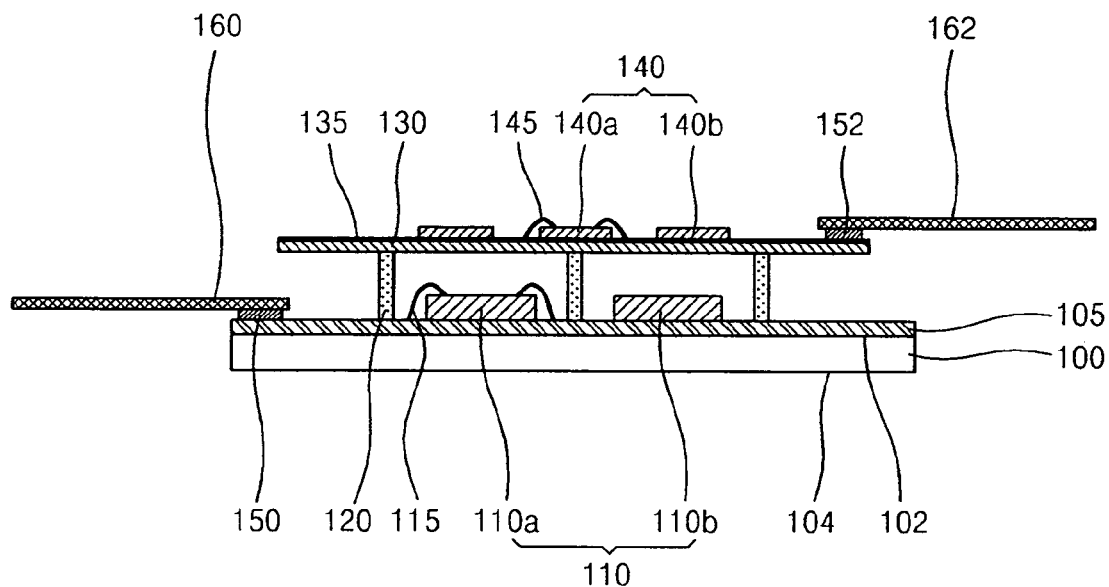

Referring to FIG. 3E, the first and second lead frames 160 and 162 are respectively installed on the first substrate 100 and the second substrate 130, and the first and second wiring patterns 105 and 135, and the first and second lead frames 160 and 162 are respectively electrically connected to each other. The first and second wiring patterns 105 and 135, and the first and second lead frames 160 and 162 may be electrically connected by first and second connection members 150 and 152, respectively. Each of the first and second connection members 150 and 152 may include a solder, a solder paste, a silver (Ag) paste, or a combination thereof. For this electrical connection, each of the first and second wiring patterns 105 and 135 and the first and second lead frames 160 and 162 may include a connection portion such as a typical connection pad. However, this is exemplary and the present invention is not limited thereto. That is, although not shown, the first and second wiring patterns 105 and 135 and the first and second lead frames 160 and 162 may be electrically connected to each other by using such a wire as described above. The first wiring pattern 105 and the second wiring pattern 135 may be connected to the outside of the power device package 10 through the first and second lead frames 160 and 162. The first and second lead frames 160 and 162 may be integrally formed with each other.

Figure 3F:
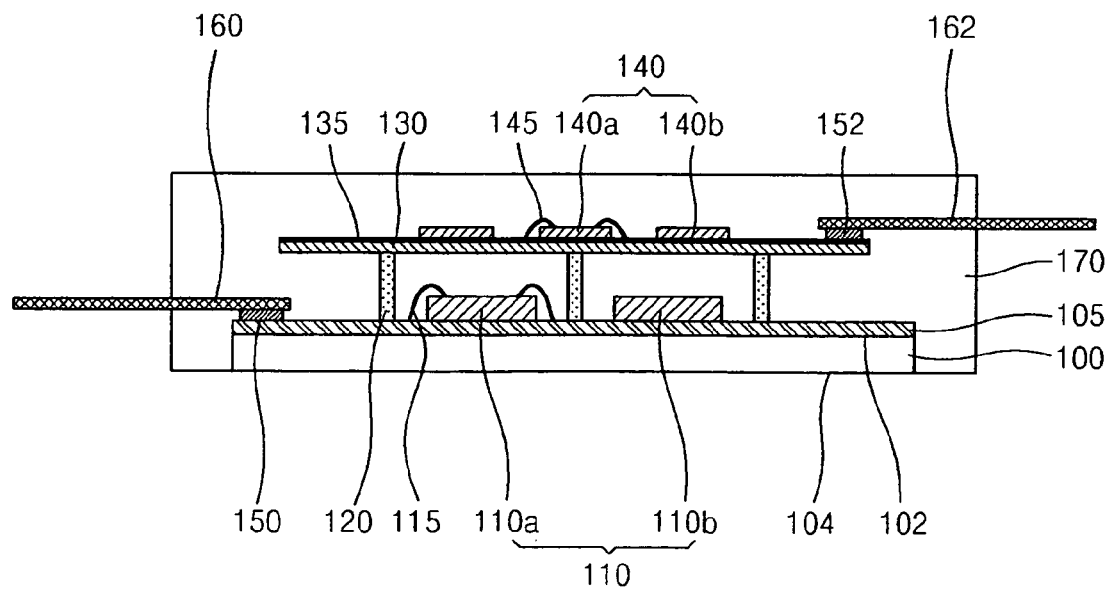

Referring to FIG. 3F, the power device package 10 is encapsulated by using a sealing member 170 by a typical transfer molding process and/or a curing process. The sealing member 170 may seal the first substrate 100, the power semiconductor chips 110, the second substrate 130, the first control semiconductor chips 140, and the support members 120, and may expose the second surface 104 of the first substrate 100. Also, the sealing member 170 seals a part of each of the first and second lead frames 160 and 162, and external leads 164 and 166 of the first and second lead frames 160 and 162 which are exposed to the outside are electrically connected to the outside of the power device package 10. The sealing member 170 may include an insulating resin, for example, an epoxy molding compound (EMC), a polyimide, a silicone, a silicone rubber, or a combination thereof. The power device package 10 may have various shapes depending on the shape of an external mold (not shown) in which the sealing member 170 is made.

Figure 3G:
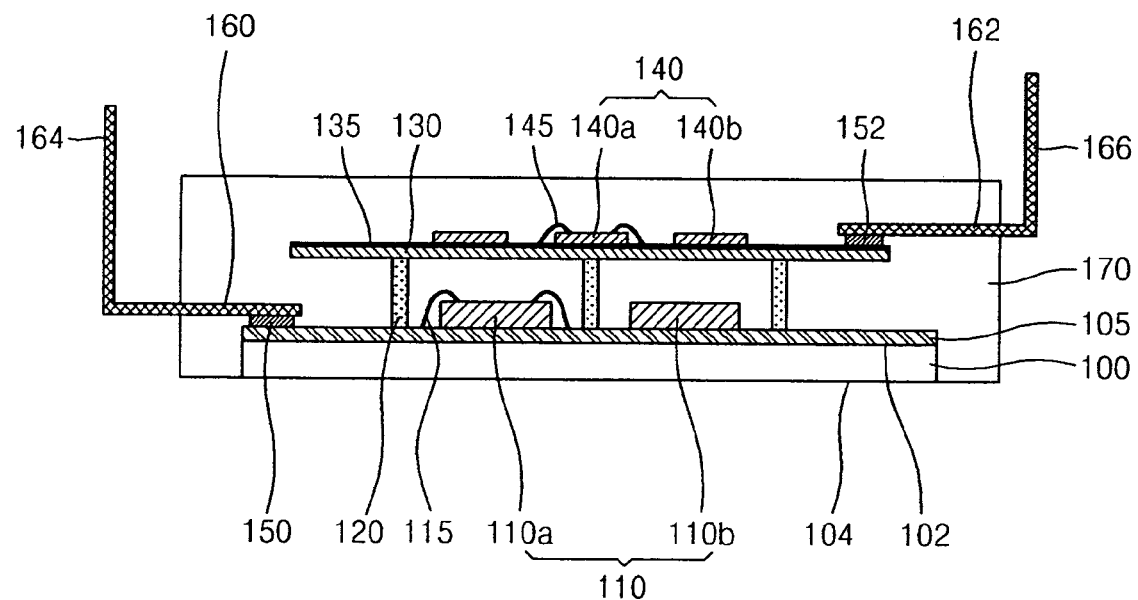

Referring to FIG. 3G, trimming is performed so that only the external leads 164 and 166 exposed to the outside of the sealing member 170 among leads of the first and second lead frames 160 and 162 are left, and forming is performed to bend the external leads 164 and 166, thereby completing the power device package 10.

Referring to FIG. 2 again, the power device package 10 may further include a heat sink 180 attached to the exposed second surface 104 of the first substrate 100, which dissipates heat. The heat sink 180 may include a metal, a metal nitride, a ceramic, a resin, or a combination thereof. For example, the heat sink 180 may include aluminum, an aluminum alloy, copper, a copper alloy, an aluminum oxide ($Al_2O_3$), a beryllium oxide (BeO), an aluminum nitride (AlN), a silicon nitride (SiN), an epoxy-based resin, or a combination thereof. The heat sink 180 may have various dimensions and shapes in order to more effectively dissipate heat. The heat sink 180 may be attached to the first substrate 100 by using a solder, a metal epoxy, a metal paste, a resin-based epoxy, or an adhesive tape with high heat resistance. The adhesive tape may be a well-known high temperature-resistant tape such as a glass tape, a silicone tape, a Teflon tape, a stainless foil tape, or a ceramic tape, or a tape including an aluminum oxide, an aluminum nitride, a silicon oxide, or a beryllium oxide. The solder may include a metal such as lead (Pb), lead/tin (Pb/Sn), tin/silver (Sn/Ag), or lead/tin/silver (Pb/Sn/Ag).

Figure 4:
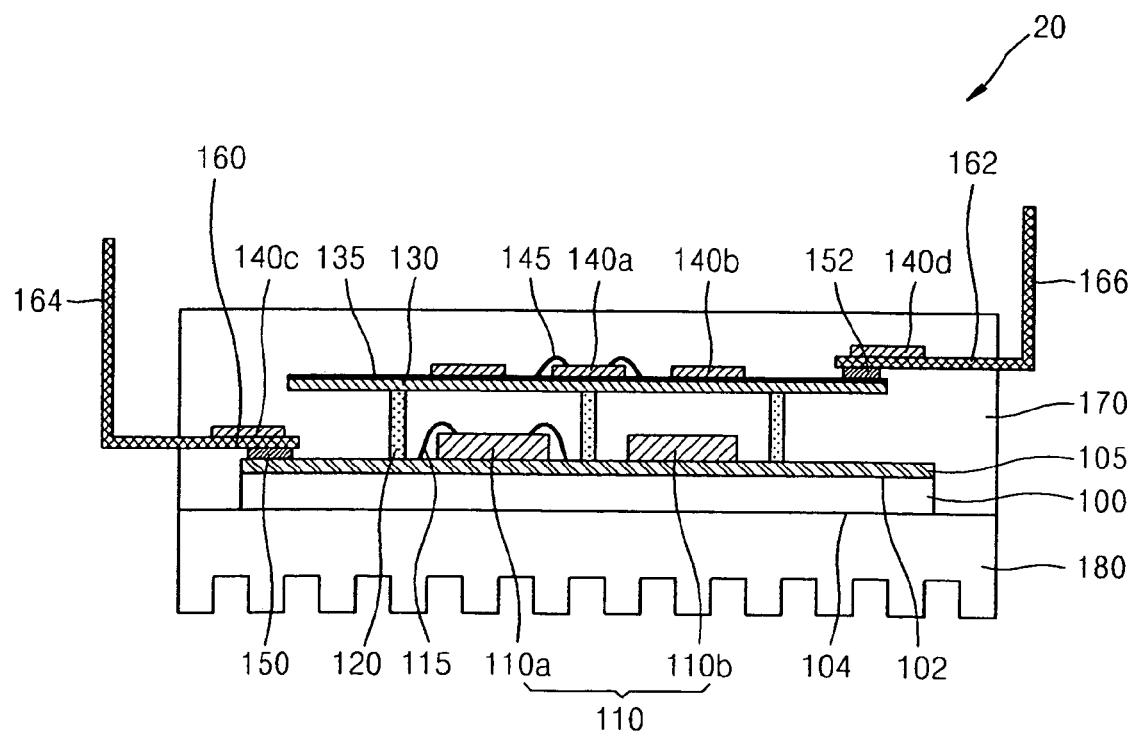
FIG. 4 is a schematic cross-sectional view of a power device package according to another embodiment of the present invention.

FIG. 4 is a schematic cross-sectional view of a power device package 20 according to another embodiment of the present invention. For convenience and accuracy, descriptions of previously described features will not be provided.

Referring to FIG. 4, the power device package 20 is characterized in that second control semiconductor chips 140c and 140d are mounted on first and second lead frames 160 and 162. Such characteristics can be applied to embodiments which will be described with reference to FIGS. 5 and 6. The second control semiconductor chips 140c and 140d may be substantially the same as the first control semiconductor chips 140 of FIG. 2. The second control semiconductor chips 140c and 140d may be mounted on only one of the first and second lead frames 160 and 162. The second control semiconductor chips 140c and 140d may be mounted on the first and second lead frames 160 and 162 to be electrically connected to the first and second lead frames 160 and 164 in the form of flip chips. Alternatively, although not shown, the second control semiconductor chips 140c and 140d may be electrically connected to the first and second lead frames 160 and 162 by using a solder ball or a typical wire, such as a wire including aluminum or gold. For this electrical connection, each of the second control semiconductor chips 140c and 140d and the first and second lead frames 160 and 162 may include a connection portion such as a typical connection pad. As shown in FIG. 4, the second control semiconductor chips 140c and 140d are electrically connected to power semiconductor chips 110 through the first and second lead frames 160 and 164 and first and second wiring patterns 106 and 135, such that the second control semiconductor chips 140c and 140d can control the operations of the power semiconductor chips 110. Since the power device package 20 of FIG. 4 can mount the second control semiconductor chips 140c and 140d on remaining spaces of the first and second lead frames 160 and 162, the size of the power device package 20 can be reduced.

Figure 5:
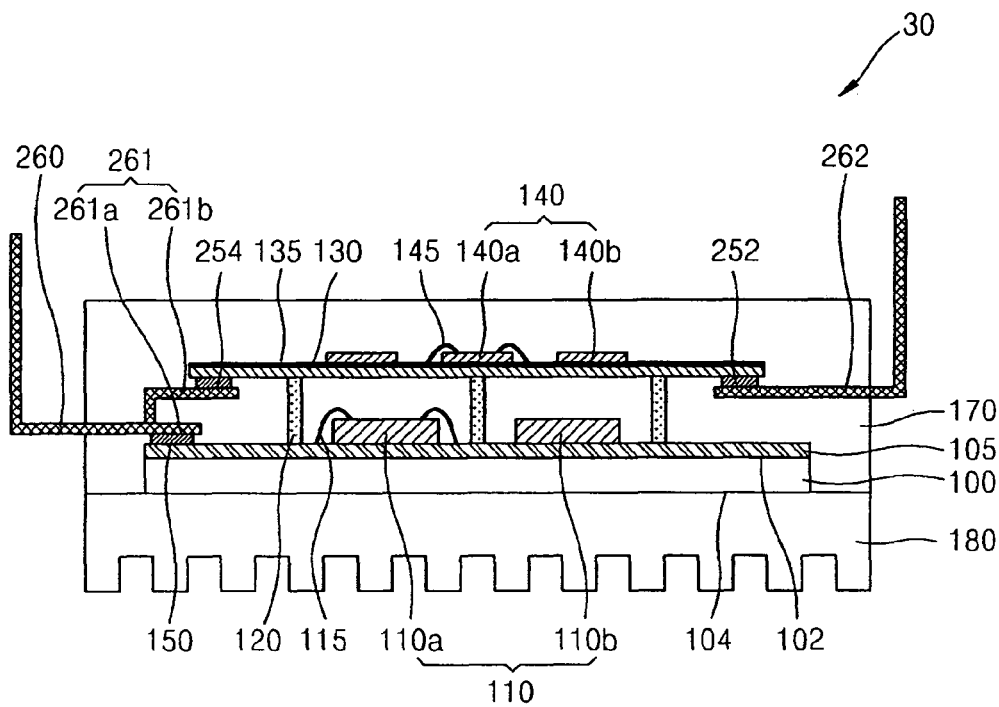
FIG. 5 is a schematic cross-sectional view of a power device package according to another embodiment of the present invention.

FIG. 5 is a schematic cross-sectional view of a power device package 30 according to another embodiment of the present invention. For convenience and accuracy, repeated explanation of overlapped features will not be given.

Referring to FIG. 5, the power device package 30 is characterized in that a second substrate 130 is supported by third and fourth lead frames 260 and 262 so that the second substrate 130 can be spaced apart from a first substrate 100. A first wiring pattern 105 may be electrically connected to the third lead frame 260 by a first connection member 150. A second wiring pattern 135 may be electrically connected to the third lead frame 260 by a third connection member 254. The second wiring pattern 135 may also be electrically connected to the fourth lead frame 262 by a fourth connection member 252.

The second substrate 130 may be supported by support members 120, which is optional. Accordingly, the support members 120 may be omitted. Although both ends of the second substrate 130 are supported by the third and fourth lead frames 260 and 262 in FIG. 5, the present invention is not limited thereto. That is, only one end of the second substrate 130 may be supported by any one of the third and fourth lead frames 260 and 262. For example, a second lead frame 162 (see FIG. 2) may be used instead of the fourth lead frame 262, or a first lead frame 160 (see FIG. 2) may be used instead of the third lead frame 260. The third and fourth lead frames 260 and 262 may be integrally formed with each other. The power device package 30 of FIG. 5 can more effectively fix the second substrate 130 due to the third and fourth lead frames 260 and 262, and thus can provide more electrical connections.

Figure 6:
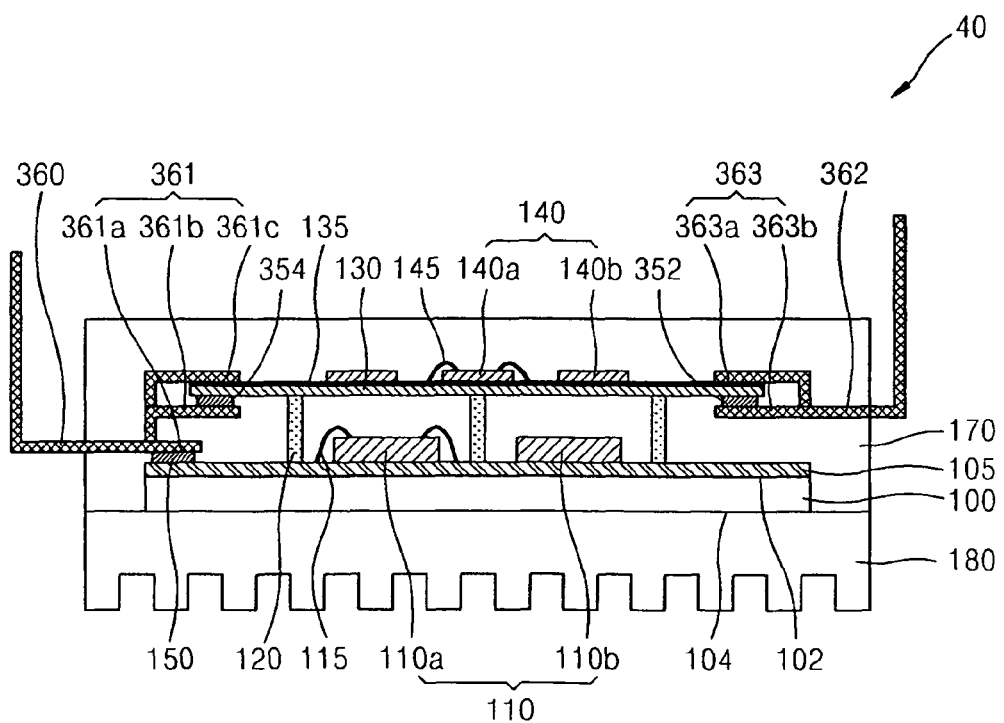
FIG. 6 is a schematic cross-sectional view of a power device package according to another embodiment of the present invention.

FIG. 6 is a schematic cross-sectional view of a power device package 40 according to another embodiment of the present invention. For convenience and accuracy, descriptions of previously described features will not be repeated.

Referring to FIG. 6, the power device package 40 is characterized in that a second substrate 130 is inserted into first and second insertion portions 361 and 363 formed in ends of fifth and sixth lead frames 360 and 362 so that the second substrate 130 can be spaced apart from a first substrate 100.

In detail, one end of the second substrate 130 is inserted into the first insertion portion 361 formed in an end of the fifth lead frame 360. The first insertion portion 361 includes first through third protrusions 361a through 361c. The first protrusion 361a is electrically connected to a first wiring pattern 105 through a first connection member 150, and accordingly, the fifth lead frame 360 is electrically connected to the first wiring pattern 105. The second substrate 130 is inserted and supported between the second protrusion 361b and the third protrusion 361c. The position of a fifth connection member 354 shown in FIG. 6 is exemplary, and the fifth connection member 354 may contact the second protrusion 361b and/or the third protrusion 361c. A second wiring pattern 135 may be electrically connected to the fifth lead frame 360 through the fifth connection member 354. If necessary, the second wiring pattern 135 may be electrically connected to the first wiring pattern 105 through the fifth connection member 354.

The other end of the second substrate 130 is inserted into the second insertion portion 363 formed in an end of the sixth lead frame 362. The second insertion portion 363 includes fourth and fifth protrusions 363a and 363b. The second substrate 130 is inserted and supported between the fourth protrusion 363a and the fifth protrusion 363b. The position of a sixth connection member 352 shown in FIG. 6 is exemplary, and accordingly, the sixth connection member 352 may contact the fourth protrusion 363a and/or the fifth protrusion 363b. The second wiring pattern 135 may be electrically connected to the second lead frame 362 through the sixth connection member 352. If necessary, the second wiring pattern 135 may be electrically connected to the first wiring pattern 105 through the fifth connection member 354.

The second substrate 130 may be supported by support members 120, which is optional. Accordingly, the support members 120 may be omitted. Although both ends of the second substrate 130 are supported by the fifth and sixth lead frames 360 and 362 in FIG. 6, the present invention is not limited thereto. For example, only one of the first and second insertion portions 361 and 363 may be formed and allow the second substrate 130 to be inserted thereinto. That is, one of the fifth and sixth lead frames 360 and 362 and one of the first through fourth lead frames 160, 162, 260, and 262 may be properly combined. The fifth and sixth lead frames 360 and 362 may be integrally formed with each other. The power device package 40 of FIG. 6 can more effectively fix the second substrate 130 due to the fifth and sixth lead frames 360 and 362, and thus can provide more electrical connections.

Figure 7A:
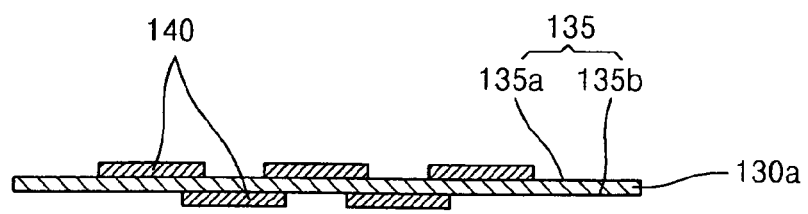
FIGS. 7A through 7C are schematic cross-sectional views illustrating a second substrate on which first control semiconductor chips are mounted according to embodiments of the present invention.
Figure 7B:
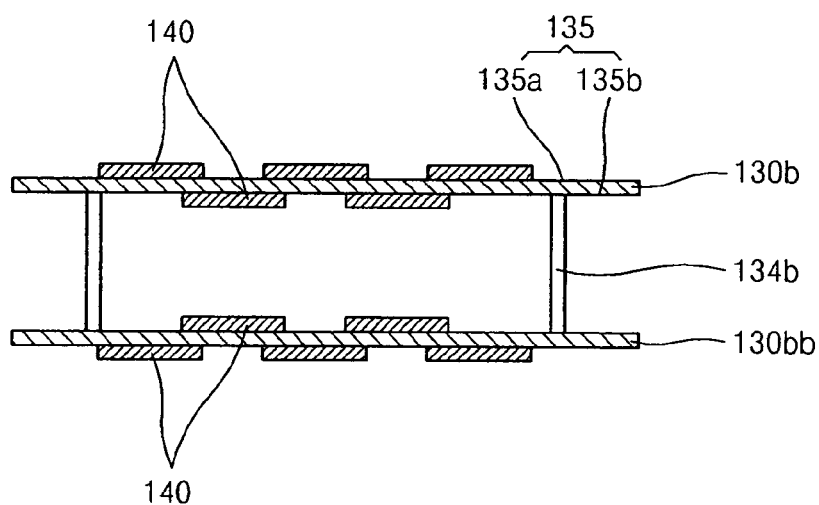
Figure 7C:
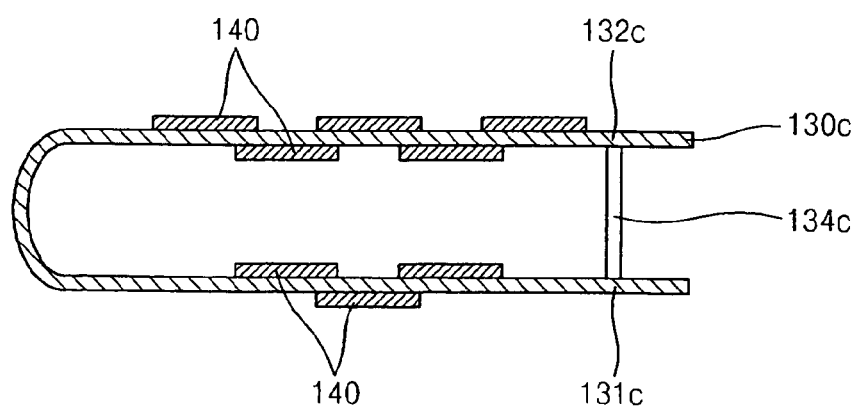

FIGS. 7A through 7C are schematic cross-sectional views illustrating second substrates 130a, 130b, and 130c on which first control semiconductor chips 140 are mounted according to embodiments of the present invention. The second substrates 130a, 130b, and 130c of FIGS. 7A through 7C may be applied to the power device packages 10, 20, 30, and 40 described with reference to FIGS. 2 through 6.

Referring to FIG. 7A, the first control semiconductor chips 140 are mounted on both surfaces of the second substrate 130a. The second substrate 130a may include one or both of an upper second wiring pattern 135a and a lower second wiring pattern 135b, and the first control semiconductor chips 140 can be electrically connected to the outside due to the upper second wiring pattern 135a and the lower second wiring pattern 135b.

Referring to FIG. 7B, the first control semiconductor chips 140 are mounted on both surfaces of each of the upper second substrate 130b and the lower second substrate 130bb which are stacked over each other. The upper second substrate 130b is supported by support members 134b, which space it apart from the lower second substrate 130bb. The support members 134b may be substantially the same as the support members 120. Each of the upper and lower second substrates 130b and 130bb of FIG. 7B may be substantially the same as the second substrate 130a of FIG. 7A. Although the two second substrates 130b and 130bb are stacked in FIG. 7B, the present invention is not limited thereto. The first control semiconductor chips 140 may be mounted on one surface and/or both surfaces of each of the upper and lower second substrates 130b and 130bb.

Referring to FIG. 7C, when the second substrate 130c is a flexible PCB, the second substrate 130c may be curved to form a plurality of mount surfaces 131c and 132c facing each other. The first control semiconductor chips 140 may be mounted over and/or under the mount surfaces 131c and 132c. The curved second substrate 130c may be supported by support members 134c.

As described above, the power device package according to the present invention can be made compact by vertically stacking the substrates on which the semiconductor chips are mounted.

Moreover, since the power device package according to the present invention puts the power semiconductor chips and the control semiconductor chips for controlling and driving the power semiconductor chips into one package, smart power modules or intelligent power modules can be realized.

The forgoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A power device package comprising:
a first substrate comprising a first surface and a second surface opposite to each other, and a first wiring pattern formed on the first surface;
one or more power semiconductor chips mounted on the first surface of the first substrate and electrically connected to the first wiring pattern;
a second substrate vertically spaced apart from the first substrate and comprising a second wiring pattern;
one or more first control semiconductor chips mounted on the second substrate and electrically connected to the second wiring pattern;
one or more insulating support members supporting the second substrate so that the second substrate is spaced apart from the first substrate, wherein each insulating support member is disposed between the first substrate and the second substrate and abuts each of the first substrate and the second substrate, and wherein each insulating support member is spaced apart from each of the one or more power semiconductor chips and each of the one or more first control semiconductor chips;

a lead frame electrically connected to the first wiring pattern and the second wiring pattern; and a sealing member sealing the first substrate, the power semiconductor chips, the second substrate, the first control semiconductor chips, the one or more insulating support members, and at least a part of the lead frame so as to expose the second surface of the first substrate.

2. The power device package of claim 1, wherein one end or both ends of the second substrate are supported by the lead frame so that the second substrate is spaced apart from the first substrate.

3. The power device package of claim 2, wherein the lead frame comprises one or more insertion portions formed on one side or both sides of ends thereof, wherein one end or both ends of the second substrate are inserted into the insertion portions of the lead frame.

4. The power device package of claim 1, wherein the first control semiconductor chips are mounted on one surface or both surfaces of the second substrate.

5. The power device package of claim 1, wherein the first control semiconductor chips are mounted on the second substrate as flip chips, or are electrically connected to the second substrate by using a wire or a solder ball.

6. The power device package of claim 1, further comprising second control semiconductor chips mounted on the first surface of the first substrate or on the lead frame and controlling the power semiconductor chips.

7. The power device package of claim 6, wherein the second control semiconductor chips are mounted on the first substrate or the lead frame to be electrically connected to the first substrate or to the lead frame in the form of flip chips, or are electrically connected to the first substrate or to the lead frame by using a wire or a solder ball.

8. The power device package of claim 1, wherein the second substrate is a printed circuit board (PCB), a ceramic substrate, an insulated metal substrate (IMS), a pre-molded substrate, a direct bonded copper (DBC) substrate, or a flexible PCB.

9. The power device package of claim 8, wherein, when the second substrate is a flexible PCB, the second substrate is curved to form a plurality of mount surfaces that are spaced apart from each other to face each other,
wherein the first control semiconductor chips are mounted on at least some of the mount surfaces.

10. The power device package of claim 1 comprising a plurality of second substrates,
wherein a plurality of mount surfaces of the second substrates are spaced apart from each other to face each other,
wherein the first control semiconductor chips are mounted on at least some of the mount surfaces.

11. The power device package of claim 1, wherein the first substrate is a PCB, an IMS, a pre-molded substrate, or a DBC substrate.

12. The power device package of claim 1, wherein the power semiconductor chips comprise power metal oxide semiconductor field effect transistors (MOSFETs), bipolar junction transistors (BJTs), insulated-gate bipolar transistors (IGBTs), diodes, or combinations thereof.

13. The power device package of claim 1, wherein the power semiconductor chips are electrically connected to the first wiring pattern of the first substrate in the form of flip chips, or are electrically connected to the first wiring pattern of the first substrate by using a wire or a solder ball.

14. The power device package of claim 13, wherein the wire comprises aluminum (Al) or gold (Au).

15. The power device package of claim 1, wherein the first wiring pattern comprises aluminum, an aluminum alloy, copper, a copper alloy, or a combination thereof.

16. The power device package of claim 1, wherein the first wiring pattern and the lead frame are electrically connected to each other by using solder, a solder paste, silver (Ag) paste, or a combination thereof.

17. The power device package of claim 1, wherein the sealing member comprises an epoxy molding compound (EMC), a polyimide, a silicone, a silicone rubber, or a combination thereof.

18. The power device package of claim 1, further comprising a heat sink attached to the second surface of the first substrate.

19. The power device package of claim 18, wherein the heat sink comprises aluminum, an aluminum alloy, copper, a copper alloy, $Al_2O_3$, BeO, AlN, SiN, an epoxy-based resin, or a combination thereof.

20. A method of fabricating a power device package, the method comprising:
preparing a first substrate comprising a first surface and a second surface opposite to each other, and a first wiring pattern formed on the first surface;
mounting one or more power semiconductor chips on the first surface of the first substrate;
electrically connecting the power semiconductor chips and the first wiring pattern;
preparing one or more insulating support members on the first surface of the first substrate;
disposing a second substrate on the one or more insulating support members wherein the one or more insulating support members are disposed between the first substrate and the second substrate, wherein the second substrate vertically spaced apart from the first substrate, and comprising a second wiring pattern and one or more first control semiconductor chips electrically connected to the second wiring pattern, wherein each insulating support member abuts each of the first substrate and the second substrate, and wherein each insulating support member is spaced apart from each of the one or more power semiconductor chips;
electrically connecting the first wiring pattern and the second wiring pattern to a lead frame; and
sealing the first substrate, the power semiconductor chips, the second substrate, the first control semiconductor chips, the one or more insulating support members, and a part of the lead frame by using a sealing member so as to expose the second surface of the first substrate.

21. The method of claim 20, after the sealing of the first substrate, the power semiconductor chips, the second substrate, the first control semiconductor chips, the support members, and the part of the lead frame, the method further comprising:
performing trimming to leave only external leads exposed to the outside of the sealing member among leads of the lead frame; and performing forming to bend the external leads.

* * * * *